United States Patent
Leroy (10) Patent No.: US 6,508,888 B1
(45) Date of Patent: Jan. 21, 2003

(54) STABILIZER CONDUCTOR COMPRISING AN ALUMINUM BASED CRYOGENIC STABILIZER

(75) Inventor: Michel Leroy, St. Egreve (FR)

(73) Assignee: Aluminium Pechiney, Paris Cedex (FR)

( * ) Notice: Subject to any disclaimer, the term of this patent is extended or adjusted under 35 U.S.C. 154(b) by 75 days.

(21) Appl. No.: 09/706,353

(22) Filed: Nov. 6, 2000

Related U.S. Application Data (63) Continuation-in-part of application No. PCT/FR00/02795, filed on Oct. 9, 2000.

(51) Int. Cl.⁷ .................................................. C22F 1/00
(52) U.S. Cl. ..................... 148/96; 148/437; 420/550; 428/614; 428/651; 428/652; 428/660; 428/930
(58) Field of Search ................. 428/930, 652, 428/651, 660, 614; 148/96, 437; 420/550

(56) References Cited

U.S. PATENT DOCUMENTS

| | | | | |
|---|---|---|---|---|
| 5,266,416 A | * | 11/1993 | Inoue et al. | 428/651 |
| 5,573,861 A | * | 11/1996 | Takahashi et al. | 148/404 |
| 5,753,380 A | * | 5/1998 | Takahashi et al. | 226/134 |

FOREIGN PATENT DOCUMENTS

| | | |
|---|---|---|
| EP | 1033726 | 9/2000 |
| JP | 57145957 | 9/1982 |

OTHER PUBLICATIONS

XP-002169351—High-Strength and High-RRR Al–Ni Alloy for Aluminum-Stabilized Superconductor—Wada et al., IEEE Transactions on Applied Superconductivity, vol. 10, No. 1, 2000, pp. 1012–1015.

XP-002169352—Development of High-Strength and High- RRR Aluminum-Stabilized Superconductor for the Atlas Thin Solenoid, Wada et al, IEEE Transactions on Applied Superconductivity, vol. 10, 2000, pp. 373–376.

* cited by examiner

*Primary Examiner*—John Sheehan
(74) *Attorney, Agent, or Firm*—Dennison, Schultz & Dougherty

(57) ABSTRACT

A superconducting conductor and method for its production. The conductor is formed of least one superconducting core and an aluminum based cryogenic stabilizer which is a high purity Al—Fe—Ni aluminum alloy having a composition, in % by weight:

200 ppm $\leq$ Fe+Ni $\leq$ 1500 ppm;
0.20 $\leq$ Fe/(Fe+Ni) $\leq$ 0.65;
optionally, B<100 ppm;
impurities other than Fe, Ni and B<0.01% total; and
remainder aluminum.

33 Claims, 3 Drawing Sheets

STABILIZER CONDUCTOR COMPRISING AN ALUMINUM BASED CRYOGENIC STABILIZER

This application is a continuation-in-part of PCT/FR00/02795, filed Oct. 9, 2000, which is incorporated herein by reference.

1. Field of the Invention

The invention relates to superconducting conductors such as single strand wires or superconducting cables comprising an aluminum based cryogenic stabilizer.

Unless mentioned otherwise, compositions are expressed as values by weight.

2. Description of Related Art

The use of very high magnetic fields of several teslas for applications such as magnetic levitation of vehicles, nuclear magnetic resonance (NMR) or physics of elementary particles, requires the use of superconducting conductors, especially in the form of cables, capable of carrying high current densities, typically greater than $10^5$ A/cm$^2$ with very low energy losses. The conductors of this type, the most frequently used of which are niobium alloy based conductors such as Nb—Ti, and occasionally Nb—Zr, are only superconducting below a very low critical temperature Tc such that cooling with liquid helium is necessary, and they only remain superconducting if the magnetic field applied to them does not exceed a critical value Hc. Therefore, it is essential to make sure that no localized thermal, mechanical or magnetic disturbance could cause a local loss of superconductivity and propagate throughout the conductor possibly causing irreversible degradation.

For these reasons, superconducting cables are usually composed of a large number of superconducting filaments with a small individual cross-sectional area (typically Ø<50 µm) embedded in a metallic matrix, thus forming a "superconducting core" and encased in a metal with high electrical and thermal conductivity such as copper or aluminum, that can quickly transfer heat to the liquid helium bath and mechanically protect the filaments, particularly during shaping operations. These operations comprise successive mechanical working steps (such as extrusion or drawing) and heat treatments (such as annealing) that can give good electrical and thermal contact between the superconducting core and the said encasing metal, which is known under the term "stabilizing casing (or cladding)" or "cryogenic stabilizer" or simply "stabilizer". In general, superconducting cores occupy 10 to 40% of the cross-section of the superconducting cables and the stabilizing casing occupies 60 to 90%. The superconducting filaments are generally made of a niobium alloy such as NbTi. The said metallic matrix has good electrical and thermal conductivities and keeps the filaments together and provides mechanical protection for them during the cable manufacturing steps. It is usually made of copper or a high purity copper alloy, and less frequently aluminum or a high purity aluminum alloy (at least 99.999% of aluminum).

The technique of using aluminum in cryogenic (or cryostatic) stabilizers for superconducting conductors is known. Aluminum has the advantage that it has very high electrical and thermal conductivities at low temperatures, together with a low density, a low specific heat and good transparency to different types of radiation. It is usually accepted that the choice of a particular aluminum will be made as a function of its resistivity at the temperature of liquid helium (4.2 K), called the "residual resistivity" that is expressed in terms of the ratio (denoted RRR) between the resistivity at ambient temperature and the residual resistivity. Since the thermal conductivity of aluminum and its alloys at 4.2 K is approximately proportional to the RRR, an aluminum with a high RRR can dissipate heat released during a local loss of superconductivity of one or more superconducting filaments more efficiently.

Since the residual electrical resistivity of aluminum depends very closely on the impurities or the alloying elements contained in it, a very pure aluminum is usually used, namely an aluminum with a purity of at least 5N, in other words a pure aluminum containing not less than 99.999% by weight of aluminum, and particularly poor in elements that could degrade the resistivity (such as Ti, V, Zr, Mn or Fe). The use of aluminum bases with this high purity considerably increases the manufacturing cost of stabilizers and superconducting conductors.

In most applications, cryogenic stabilizers must also be capable of resisting high mechanical tension or compression stresses that are largely caused by electromagnetic forces. These stresses, which may be cyclic, cause deformation of the stabilizer and increase the residual resistance over a period of time, or simply at the time of winding or cooling to the temperature of the liquid helium.

In order to overcome these disadvantages, European patent application EP 500 101 (corresponding to American patent U.S. Pat. No. 5,266,416) describes using a cryogenic stabilizer made of an aluminum alloy with a yield stress at 0.2% elongation equal to at least 40 MPa and an RRR equal to at least 250, at very low temperatures (typically 4.2 K). These characteristics may be obtained by using Zn, Si, Ag, Cu or Ce as elements of addition added to an aluminum base with a purity equal to at least 5N. However these mechanical properties are insufficient for applications such as medical imagery by NMR (Nuclear Magnetic Resonance) For this application, a stabilizing casing that is almost universally used at the moment is made of copper with a residual resistivity to liquid helium of less than 5.4 nΩ.cm, and a yield stress measured at ambient temperature exceeding 80 MPa. A disadvantage of this solution is the high copper density that very much increases the weight of the windings and increases the direct and indirect cost (for example by the use of larger coil supports).

French application FR 2 707 419 (corresponding to American patent U.S. Pat. No. 5,573,861) also proposes using a cryogenic stabilizer made of high purity aluminum (from 99.9 to 99.9999% by weight) with a crystalline structure possessing a specific orientation relative to the longitudinal direction of the conductor. However, this preferred orientation of the grain after extrusion requires the use of extremely pure and only very slightly alloyed aluminum, and therefore with mechanical properties that are far too low for many applications.

For the same reasons, French application FR 2 707 420 (corresponding to American patents U.S. Pat. Nos. 5,753,380 and 5,733,389) also proposes to use a cryogenic stabilizer made of a high purity aluminum (from 99.8 to 99.9999% by weight) containing at least one "active" metallic or semi-metallic element, particularly such as B, Ca, Ce, Ga, Y, Yb and Th, most of which would be in solid solution. Published results also show that the mechanical properties are much lower than for copper.

The article by A. Yamamoto et al., "Design and Development of the ATLAS Central Solenoid Magnet", published in the IEEE Transactions on Applied Superconductivity, pp. 852–855, Vol. 9, No. 2, June 1999, also describes the use of a 5N based aluminum alloy with 1000 ppm by weight of Ni that can be used to make a stabilizer with an RRR of about 600 and a yield stress at 0.2% elongation of 110 MPa at 4.2

K and 81 MPa at 300 K, after cold drawing corresponding to an elongation of 27% and a 21% reduction in the cross-section (1/1.27=0.79). However, cold elongation of the composite formed by the superconducting core and its stabilizing casing of this magnitude is at the limit of what is possible for this type of composite without local necking or rupture.

International application WO 00/17890 also describes a process for the production of superconducting cables comprising an aluminum alloy stabilizer with hardening by precipitation, with a very pure base containing 100 ppm to 25000 ppm of Ni. According to this process, a precipitation heat treatment is applied to the alloy at a temperature between 250° C. and 500° C., before covering the superconducting core by hot extrusion. Starting from a very pure aluminum base (typically 5N according to examples 1 to 3), it is possible to add elements other than Ni that do not increase the resistivity of aluminum and that are chosen from among Ag, As, Bi, Ca, Cd, Cu, Ga, Mg, Pb, Sc, Si, Sn and Zn. The sum of the alloying elements other than the latter elements (such as Fe) must not exceed 10 ppm.

The mechanical properties of the composite cable comprising a superconducting core and a stabilizing casing made of an aluminum alloy were measured at the temperature of liquid helium (4.2 K). The values corresponding to the aluminum alloy alone (i.e. without the superconducting core) are not given but they are necessarily very much lower than the values for the composite, since the mechanical properties of the superconducting core that is formed of filaments of the Nb—Ti superconductor encased in work hardened copper that forms a large proportion of the cross-section of the cable, are very high. Furthermore, the mechanical properties of the aluminum alloy measured at 4.2 K are very much higher than the properties measured at ambient temperature (300 K) as will be seen in the following sections.

In a presentation entitled "Progress in ATLAS Central Solenoid Magnet" presented at the 16$^{th}$ International Conference on Magnet Technology (Florida, 1999), Yamamoto et al. indicated the following values for Al+0.1% Ni alloy (in other words an alloy containing no alloying element other than Ni) treated by precipitation at 430° C. and after final reduction of the cross section by 21% cold working:

yield stress of the alloy at 4.2 K=110 MPa,

RRR of the alloy=570;

yield stress of the composite cable at 4.2 K=146 MPa, which demonstrates the "reinforcement" effect due to the superconducting core in the composite cable.

In the same conference, K. Wada et al. made a presentation entitled "Development of High-Strength and High-RRR Aluminum Stabilized Superconductor for the ATLAS Thin Solenoid" containing results on alloys with 0.05% and 0.1% of Ni formed by the addition of Ni to 5N base aluminum, without any other element of addition. The values that they obtained on laboratory samples (Y.S. denotes the yield stress) are shown in table A.

For industrial cables, the measured values on the stabilizer made of a 0.1% Ni alloy after cold working to reduce its final cross-section by 21% were:

RRR 591 to 593, 0.2% Y.S. at ambient temperature 80 to 83 MPa, 0.2% Y.S. at 4.2 K=110 MPa.

This example shows the large difference between the mechanical properties of the aluminum alloy at ambient temperature and at 4.2 K.

Furthermore, the authors consider that this significant improvement in the performances of the industrial product compared with laboratory samples is due to slightly different and better transformation conditions.

TABLE A

| Final reduction | 15% | | 20% | | 25% | |
|---|---|---|---|---|---|---|
| in the cross-section Alloy | 0.2% Y.S. (MPa) | RRR | 0.2% Y.S. (MPa) | RRR | 0.2% Y.S. (MPa) | RRR |
| Al + 0.05% Ni | 57.3 | 620 | 63.9 | 583 | 67.3 | 564 |
| Al + 0.1% Ni | 60.5 | 522 | 67.7 | 530 | 70.2 | 517 |

The applicant looked for means of simultaneously obtaining a residual resistivity at 4.2 K less than 5.4 nΩ.cm (giving an RRR at 300 K greater than about 500) and reinforced mechanical properties, in other words a yield stress at 0.2% elongation (Y.S. at 0.2% elongation) measured at ambient temperature greater than 75 MPa, and preferably greater than 85 MPa, starting from an aluminum base less expensive than the 5N purity base normally used for this type of product, all at acceptable costs for industrial use (such as series production of superconducting coils designed for use in NMR imagery devices).

SUMMARY OF THE INVENTION

The subject of the invention is a superconducting conductor such as a superconducting wire or cable comprising at least a superconducting core and a cryogenic stabilizer composed entirely or partly of a high purity aluminum alloy with the following composition:

200 ppm≦Fe+Ni≦1500 ppm;

0.20≦Fe/(Fe+Ni)≦0.65;

optionally, B<100 ppm;

remainder aluminum with purity greater than 99.99% by weight.

Another subject of the invention is a cryogenic stabilizer preform composed of the said high purity aluminum alloy.

The applicant observed that quite surprisingly, the simultaneous presence of iron (Fe) and nickel (Ni) as alloying elements in the claimed proportions could give a significantly better compromise between the RRR and mechanical properties than are possible with binary alloys, using a base aluminum with 4N purity, with lower quantities of alloying elements and more moderate final cold drawing ratios, avoiding risks of failure (or "rupture") of the conductor during this drawing operation. For example, it is possible simultaneously to obtain an RRR>600 and a yield stress at ambient temperature higher than 85 MPa with an alloy containing less than 700 ppm of Fe+Ni. In general, iron is not recommended as an element of addition to a pure aluminum base, despite its very low solubility limit in solid aluminum at moderate temperatures (200 to 400° C.) since its coefficient of diffusion in aluminum is very low and the holding times (i.e. thermal treatment durations) necessary to approach this solubility limit are incompatible with industrial use (several weeks are necessary).

Another subject of the invention is a process for obtaining a cryogenic stabilizer preform for the manufacture of a superconducting conductor according to the invention, that includes the formation of an initial preform in the unprocessed state and a hot mechanical working operation on the said preform, with a reduction of the cross-section of at least 90% at a temperature preferably between 200° C. and 400° C. Preferably, the said process for obtaining this preform also comprises a precipitation annealing at a temperature of between 300° C. and 400° C. for at least 8 hours, and preferably between 320 and 380° C., after the said mechanical working operation.

The applicant observed that the use of a preform precipitation annealing after the mechanical working operation rather than before it, can significantly improve the combination of the RRR and the mechanical properties for the final stabilizer. The combination of mechanical working and precipitation annealing can significantly limit the time necessary to reach optimum precipitation of the iron and nickel.

Another subject of the invention is a production process for a superconducting conductor according to the invention that comprises at least one operation to insert at least one superconducting core in a stabilizer starting from a preform according to the invention. Preferably, this process also comprises an operation to reduce the cross-section of the conductor in order to obtain a cross section preferably between 1.10 and 1.33 times the final cross-section of the superconducting conductor followed by a restoration heat treatment and a final cold working operation to reduce the conductor cross-section to the required final cross-section.

The applicant observed that the use of an "intermediate" restoration heat treatment, in other words on a superconducting conductor blank with a cross-section slightly greater than the cross-section of the final conductor, can significantly increase the mechanical properties of the final stabilizer without excessively degrading the RRR, thus giving an optimized and adjustable compromise between the RRR and the mechanical properties.

Another subject of the invention is the use of at least one superconducting conductor according to the invention in a magnetic device such as a superconducting magnetic coil.

DETAILED DESCRIPTION OF THE INVENTION

Figure 1:
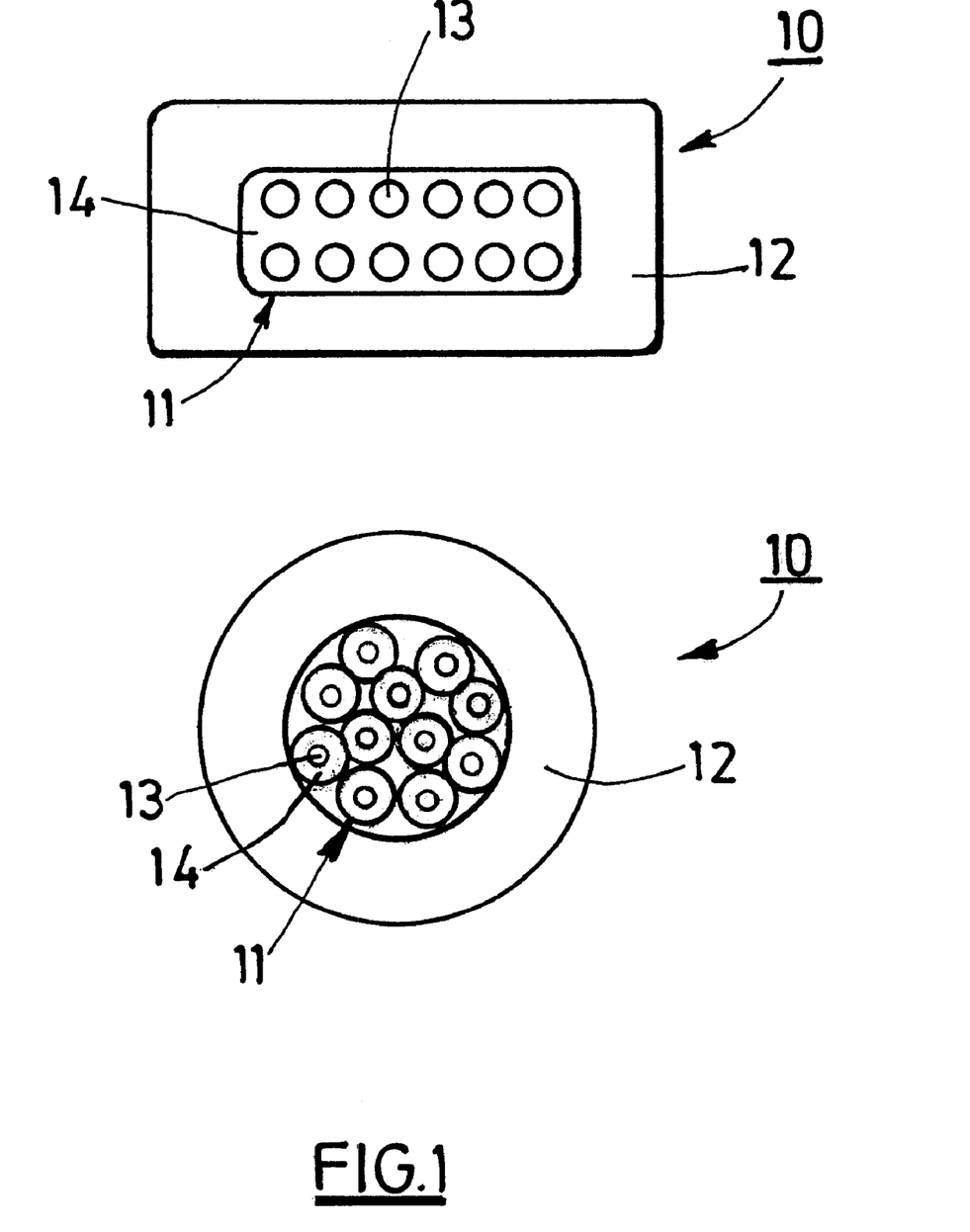
FIG. 1 illustrates a cross-section through the typical structure of a superconducting conductor according to the invention.

The superconducting conductor (10) according to the invention comprises at least one superconducting core (11) and a cryogenic aluminum based stabilizer (12) and is characterized in that the stabilizer (12) is entirely or partly composed of a high purity aluminum alloy, called Al—Fe—Ni, with composition:

200 ppm≦Fe+Ni≦1500 ppm;
0.20≦Fe/(Fe+Ni)≦0.65;
optionally, B<100 ppm;
the sum of the contents of inevitable impurities other than Fe, Ni and B<0.01%;
the remainder aluminum.

Each superconducting core (11) is typically composed of one or several superconducting filaments (13) with a small unit cross-section (typically Ø<50 μm) and a matrix (14) made of a high purity copper or copper alloy, or a high purity aluminum or aluminum.

Preferably, the total Fe+Ni content is less than or equal to 1200 ppm (in other words 200 ppm≦Fe+Ni≦1200 ppm).

Preferably, the inevitable impurities in the said alloy comprise less than 10 ppm of silicon (Si) and less than 5 ppm of manganese (Mn). The silicon content and the manganese content of the said Al—Fe—Ni high purity alloy is preferably limited to the values given above since these elements tend to remain in solid solution in aluminum and degrade the RRR without improving the mechanical properties.

The said high purity Al—Fe—Ni aluminum alloy may also possibly contain up to 100 ppm of boron (B) as an alloying element, in other words the content of boron by weight is less than 100 ppm. The presence of boron (B) can avoid risks of the electrical conductivity dropping if the base aluminum used contains impurities such as titanium (Ti), vanadium (V) or zirconium (Zr) which are normally not present in 5N grades but which may be present in 4N bases. Boron makes these elements precipitate by physicochemical reaction with them. When these elements are present in significant quantities (for example a total of more than 2 ppm), the boron content is preferably equal to at least 20 ppm (in other words the content of the boron in the said alloy is preferably between 20 and 100 ppm) to ensure that they are precipitated in the form of borides during heat treatment of the alloy. These borides degrade the conductivity much less than the undesirable elements in solid solution.

The required content of boron may be obtained by adding a master (or "mother") alloy containing boron (such as AB4) to a high purity aluminum base, or a salt containing boron reducible by liquid aluminum such as potassium fluoborate.

The sum of the inevitable impurities other than Fe, Ni and B in the said alloy is preferably less than 0.005%, and even better less than 0.001%, which prevents the inevitable impurities from containing any elements that would not have any good effect on the mechanical properties, but would introduce the risk of slightly degrading the electrical properties.

Preferably, a large proportion of the iron and the nickel present in the said high purity Al—Fe—Ni aluminum alloy according to the invention is in the form of small intermetallic particles (the size of which is typically less than 1 μm). More precisely, the total quantity of Fe and Ni alloying elements in solid solution in the aluminum in the said alloy is less than 20 ppm (the rest of these elements being "precipitated" in the form of intermetallic particles). The said particles are partly formed during solidification of the alloy in the form of relatively coarse particles (about 3 μm to 20 μm). A precipitation heat treatment (step D in FIG. 2) can form a large number of small particles, in other words smaller than about 1 μm (also called "fine precipitates") starting from alloying elements that remained in solid solution after the liquid alloy solidification operation, which has a good impact on the mechanical properties. The said treatment consists of heating the product to a temperature typically between 300 and 400° C. for a time that depends on the treatment temperature and that is at least 8 hours (the duration is longer when the temperature is lower). Prior mechanical working encourages the dispersion of precipitation sites of the said small precipitates, which also has a very favorable effect on the mechanical properties of the product.

Figure 2:
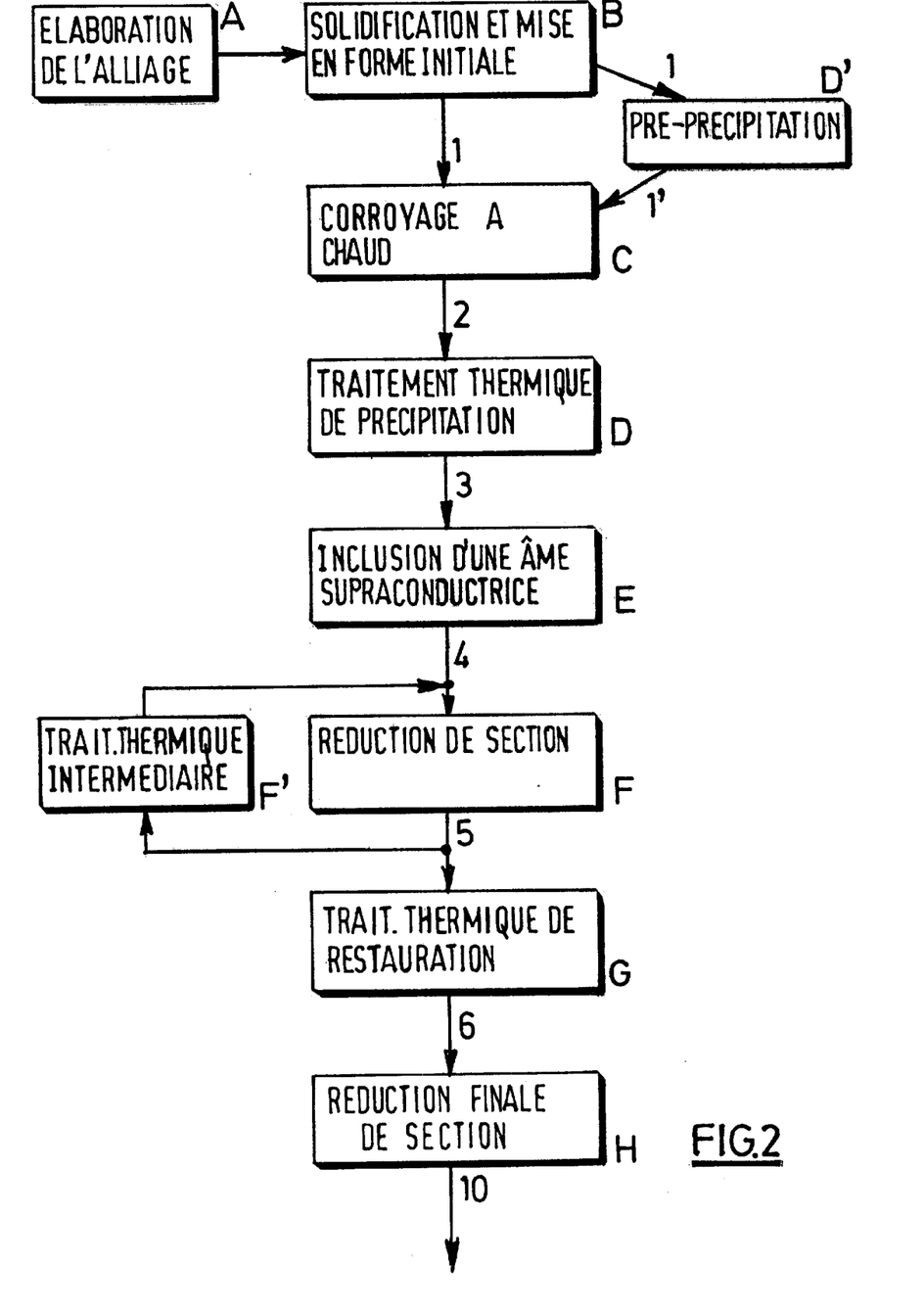
FIG. 2 diagrammatically illustrates a process for manufacturing a superconducting conductor according to the invention.

The cryogenic stabilizer preform (1, 2, 3) according to the invention is characterized in that it is composed entirely or partly of the said high purity Al—Fe—Ni aluminum alloy. The said preform (1, 2, 3) is intended for the production of a superconducting conductor particularly by continuous co-extrusion of the preform and the superconducting core. In particular, the said co-extrusion may be done using the "conform" process which is known under the trademark "CONFORM®" (by the Holton Machinery Ltd Company) and which, for example, is described in American patent U.S. Pat. No. 4,564,347 (corresponding to European application EP 125 788). The conform process is a continuous extrusion process using a rotating machine, usually with groove(s). This process enables the continuous insertion of a core (with one composition) in a preform (with another composition and usually in the form of wire with a circular or rectangular cross-section) that is placed on a rotating wheel comprising at least one groove and one shoe and that is driven by the said wheel to an "insertion chamber" in which the core is inserted in the preform. The shoe is a part that is inserted in the groove to modify the final shape of the preform by pressure. The process increases the temperature of the preform and the core typically to the order of 300 to 400° C., for a very short duration (a few seconds) such that the metallurgical precipitation states of the core and the preform are not significantly modified by the conform process.

The superconducting conductor can also be produced by filling a hollow preform. The preform is typically in the form of a wire, bar or a hollow bar.

The preform according to the invention has preferably been subjected to a hot mechanical working operation (step C in FIG. 2) at a temperature typically between 200 and 400° C., reducing the cross-section by a factor equal to at least 10. This mechanical working operation is advantageously followed by a precipitation heat treatment (step D in FIG. 2), which preferably includes annealing for at least 8 hours at a temperature between 300° C. and 400° C.

The high purity Al—Fe—Ni alloy according to the invention can be obtained by adding the "elements of addition" or "alloying elements" (Fe, Ni) in the required proportions, to an "aluminum base" with purity greater than 4N, in other words an aluminum base in which the content of elements other than aluminum (but including iron and the inevitable purities) is less than 0.01% by weight. The said elements of addition are typically added in the form of a master alloy or pure metals, or possibly a salt in the case of boron (for example potassium fluoborate, which is reduced by liquid aluminum releasing boron).

The applicant noted that surprisingly, it is sufficient to use an aluminum base with a purity of between 99.99% and 99.999%, whereas prior arts suggests that aluminum bases with a purity equal to at least 99.999% should be used, in particular containing very low contents of Fe which is an element considered to be particularly harmful according to the teaching of prior art. In other words, the composition of the high purity Al—Fe—Ni alloy used according to the invention can contain a total content of inevitable impurities greater than 0.001% and up to 0.01%, but the mechanical and electrical properties are just as good with an aluminum base containing less than 0.001% of impurities.

Another subject of the invention is a process for obtaining a cryogenic stabilizer preform (1, 2, 3) that can co-precipitate almost all alloying elements. This process is characterized in that it comprises a precipitation treatment on the mechanically worked product (for example by extrusion) before final shaping.

More precisely, the process for obtaining a cryogenic stabilizer preform according to the invention is characterized in that it comprises:

the preparation (or production) by fusion and alloying (i.e. adjustment of the composition) of an aluminum alloy with the composition of the said high purity Al—Fe—Ni alloy according to the invention (step A in FIG. 2);

the formation of a rough (or "as cast") preform (1) by solidification and shaping of the said alloy, preferably in the form of an elongated product with an approximately constant straight cross-section (step B FIG. 2).

The said solidification and shaping operations (step B) may be done by continuous casting (for example to produce wire) or semi-continuous casting (for example to produce a billet) or by molding.

In the preferred embodiment of the invention, this process also comprises a hot mechanical working operation of the rough preform (1) (step C in FIG. 2), with a reduction of the straight cross-section equal to at least 90% (which produces a mechanically worked preform (2)). The mechanical working operation (step C) may be done in one or several steps called "passes". The mechanical working temperature is preferably typically between 200 and 400° C. This mechanical working is typically done by extrusion or by rolling. When wire is continuously cast with continuous rolling, the temperature at which the last rolling passes are done is preferably below 400° C. A mechanical working temperature below 400° C. encourages the formation of very fine germs of intermetallic precipitates during mechanical working, starting from alloying elements that remained in solid solution in the aluminum.

The hot mechanical working operation (step C) is preferably followed by a precipitation heat treatment (step D) of the preform (2) in order to entrain the precipitation of alloying elements (Fe, Ni and if applicable B). This treatment is preferably carried out at a temperature of between 300 and 400° C. for a time exceeding about 8 hours. This time is longer when the temperature is lower, and is shorter if prior mechanical working was extensive (extensive mechanical working increases the number of precipitation germs for the alloying elements).

The applicant observed that the mechanical working operation (C) and the heat treatment (D) could give a very high RRR with industrially acceptable heat treatment times, typically a few hours or possibly a few days, rather than a few weeks.

It is possible to carry out a preliminary heat treatment called a "pre-precipitation" treatment (D') on the rough cast preform (1) and before the mechanical working operation (C) of the preform (1').

According to another preferred embodiment of the invention, the alloyed molten alloy is continuously cast in the form of a bar (1) in a cooled rotating heel with a groove (B), this bar (1) is then continuously hot rolled in a multi-cage roller (C) to reduce the cross-section by at least 90% in several passes (the final passes preferably being carried out at a temperature of less than 400° C.) in order to produce a preform (2) with the shape of a wire with an approximately circular cross-section. The wire thus obtained is very long, in other words typically several kilometers. A precipitation heat treatment of the alloying elements (D) is then applied to this wire (2) at a temperature between about 300 and 400° C.

Another subject of the invention is a process for production of the superconducting conductor. Preferably, this process comprises at least one operation to insert a superconducting body into the stabilizer (E) and is characterized in that it comprises the supply of a cryogenic stabilizer preform according to the invention, or the production of this preform by the production process according to the invention. Each insertion operation (E) may be done using the CONFORM® process or by filling the preform.

The process typically comprises co-extrusion (step E) of a blank (3, 4) comprising a superconducting material (usually a superconducting core (11) formed of thin superconducting alloy filaments coated in a copper matrix) and a peripheral casing (the said cryogenic stabilizer (12)) made entirely or partly from a high purity aluminum alloy Al—Fe—Ni according to the invention. According to a first variant, the said blank may be produced by extrusion of a hollow bar mase of high purity Al—Fe—Ni aluminum alloy according to the invention, and filling the inside of the bar with the superconducting material in order to form a central core. According to another preferred variant of the invention, the said blank (3) may be produced by the conform process (CONFORM®).

The production process usually comprises at least one operation (step F) to reduce the cross-section of the conductor (4) produced by the said at least one insertion operation (E). When the production process comprises several operations to reduce the cross-section, it is usually advantageous to carry out intermediate heat treatments (F') between the reduction operations (F) when necessary to restore a sufficient elongation capacity to the alloy, which was work hardened in the previous passes.

The production process according to the invention is characterized in that a restoration heat treatment (step G) is performed before the final shaping passes of the superconducting conductor (5) (step F), in other words before the final cold reduction of the cross-section by about 10 to 25% (corresponding to an elongation of about 10 to 33%), to prevent the stabilizer from breaking during final mechanical working, while avoiding an irreversible reduction to the yield stress. Preferably, this treatment is carried out at a temperature of between about 150 and 350° C. for about one hour, and, if applicable, cooler than the temperature of the precipitation treatment (D) previously performed on the preform (2) after the mechanical working operation, so that it is high enough to ensure that the work hardened alloy has a sufficient elongation capacity, and sufficiently low to prevent significant increase in the alloy grain size and to prevent re-dissolution of the alloying elements previously precipitated during the precipitation treatment (D).

The production process for the superconducting conductor according to the preferred variant of the invention is characterized in that it includes the continuous insertion (E) of at least one superconducting core in a stabilizer preform (3) made of a high purity Al—Fe—Ni alloy according to the invention, in order to obtain a rough composite conductor (4) (or "superconducting conductor blank") composed of at least one superconducting core encased by (or cladded with) a cryogenic stabilizer made of a high purity Al—Fe—Ni aluminum alloy, the said insertion operation (E) being followed by one or several intermediate reductions in the cross-section (F), possibly separated by annealing operations to restore the elongation capacity (F') until the cross-section obtained is 1.10 to 1.33 times the required final cross-section, and restoration of the elongation capacity followed by a final cold reduction in the cross-section (H) by extrusion, drawing or rolling until the required final cross-section is obtained.

Thus, according to the invention, it is particularly advantageous to perform:
- an operation (F) to reduce the cross-section of the conductor blank (4) in order to obtain an intermediate blank (5) with a cross-section of between 1.10 and 1.33 times the final cross-section of the said superconducting conductor (10), as a function of the required compromise between RRR and the final mechanical properties;
- followed by a restoration heat treatment (G) of the said intermediate blank (5) that produces a said "restored" blank (6);
- followed by a cold working operation to reduce the cross-section (H) of the said restored blank (6) to obtain a superconducting conductor (10) with the said final cross section.

EXAMPLES

Example 1

Tests were carried out on five alloys (E1 to E5) under the conditions described below. The composition of these alloys is defined in table 1. These alloys were produced and cast in cylindrical billets with a diameter of 115 mm by vertical directional solidification in a mold at a solidification rate of 20 to 50 mm/minute. The metal base was aluminum refined by electrolytic refining using the "3 layer" process with "4N" purity containing 3 to 12 ppm of Fe, 2 to 4 ppm of Si, 2 to 3 ppm of Cu, 2 to 5 ppm of Zn, 1 to 4 ppm of Mg and a total of up to 10 ppm of various other impurities (including 2 to 3 ppm of phosphorus (P) and 1 to 2 ppm of rare earths, the content of each of the elements Ti, V and Zr being less than 1 ppm).

TABLE 1

| Alloy | Composition [ppm by weight] | | | | | |
|---|---|---|---|---|---|---|
| | Fe | Ni | Si | Cu | Zn | Mg |
| E1 | 100 | 100 | 4 | 3 | 3 | 3 |
| E2 | 200 | 200 | 2 | 2 | 2 | 2 |
| E3 | 400 | 400 | 3 | 3 | 5 | 4 |
| E4 | 250 | 400 | 4 | 3 | 3 | 3 |
| E5 | 400 | 250 | 3 | 2 | 2 | 1 |

20 mm diameter and 40 mm long cylindrical samples were taken from as cast billets, for which the resistivity at 4.2 K in liquid helium was measured by an inductive method.

Furthermore, a segment of each billet was homogenized for 24 hours at 500° C., and samples with the same dimensions as above were taken to measure the resistivity of the alloy after a homogenization treatment.

Finally, another segment was taken on the non-homogenized billets (as cast), and a 24-hour precipitation treatment was carried out on these billets at 420° C., followed by a 144-hour heat treatment at 370° C. The resistivity of these billets was then measured under the same conditions as above.

TABLE 2

| | As cast | | Homogenized (24 h at 500° C.) | | Annealed (24 h at 420° C. + 144 h at 370° C.) | |
|---|---|---|---|---|---|---|
| Alloy | $\rho$ (4.2 K) [nΩ · cm] | RRR | $\rho$ (4.2 K) [nΩ · cm] | RRR | $\rho$ (4.2 K) [nΩ · cm] | RRR |
| E1 | 16.08 | 175 | 10.71 | 262 | 4.45 | 626 |
| E2 | 20.76 | 135 | 10.11 | 277 | 5.04 | 555 |
| E3 | 22.68 | 124 | 9.64 | 290 | 7.72 | 362 |
| E4 | 18.76 | 150 | 9.61 | 291 | 6.05 | 462 |
| E5 | 23.08 | 122 | 11.39 | 246 | 8.32 | 336 |

Table 2 shows the results obtained, expressed in nΩ.cm at 4.2 K and in RRR. The RRR is the ratio between the resistivity at 300 K (denoted $\rho$(300 K)) and the resistivity measured at 4.2 K (denoted $\rho$(4.2 K)) and was calculated using the relation $(2790+\rho(4.2\ K))/\rho(4.2\ K)$, where $\rho$(4.2 K) is expressed in nΩ.cm and the value of 2790 nΩ.cm is the thermal component of the resistivity of an ultra-pure aluminum at 300 K, with a residual resistivity at 4.2 K less than 0.1 nΩ.cm.

It is observed that the homogenization heat treatments, or the precipitation annealing with an industrial acceptable duration, only moderately improves the resistivity of as cast products. Therefore these treatments, recommended by patent application WO 00/17890, are not very useful for ternary alloys containing iron.

A 150 mm long as cast segment was then taken from each casting lot, and was scalped to remove the peripheral cortical zone, thus reducing the diameter from 115 mm to 100 mm. These segments were heated to a temperature of 370° C. for 4 hours, and then drawn in a press at the same temperature to produce 10 mm diameter wire blanks, which represents a reduction in the cross-section of 99%. They were then allowed to cool naturally in air, and the temperature dropped to less than 50° C. in about 10 minutes.

Samples were taken on each alloy to measure the resistivity and the mechanical properties in their state as is after hot extrusion, in other words on Ø 10 mm blanks drawn in the press at 370° C. The measurements of the mechanical properties were made at ambient temperature. A 168 hour precipitation annealing was carried out at 375° C. on other samples, and the mechanical properties and the resistivity were measured after this additional heat treatment. Table 3 contains the results obtained for a yield stress (Y.S.) at 0.2% elongation and for the RRR.

It was found that the precipitation annealing treatment is much more efficient on a blank drawn in the press than on an as cast billet, but the very significant improvement in the RRR is accompanied by a considerable reduction in the mechanical properties (particularly the yield stress at 0.2% elongation).

It is also found surprisingly that the improvement in the RRR is lower for alloy E1 which contains the fewest elements of addition. A tentative explanation could be that this unexpected result might be due to the fact that in alloys with very few added elements, it is more difficult to create enough precipitate germs quickly to collect added elements that had remained in supersaturated solution in the metal mass.

TABLE 3

| Alloy | As extruded | | After precipitation annealing | |
|---|---|---|---|---|
|  | 0.2% Y.S. [MPa] | RRR | 0.2% Y.S. [MPa] | RRR |
| E1 | 29 | 291 | 15 | 680 |
| E2 | 35 | 260 | 18 | 910 |
| E3 | 37 | 210 | 21 | 825 |
| E4 | 36 | 250 | 19 | 690 |
| E5 | 33 | 240 | 18 | 805 |

Figure 3A:
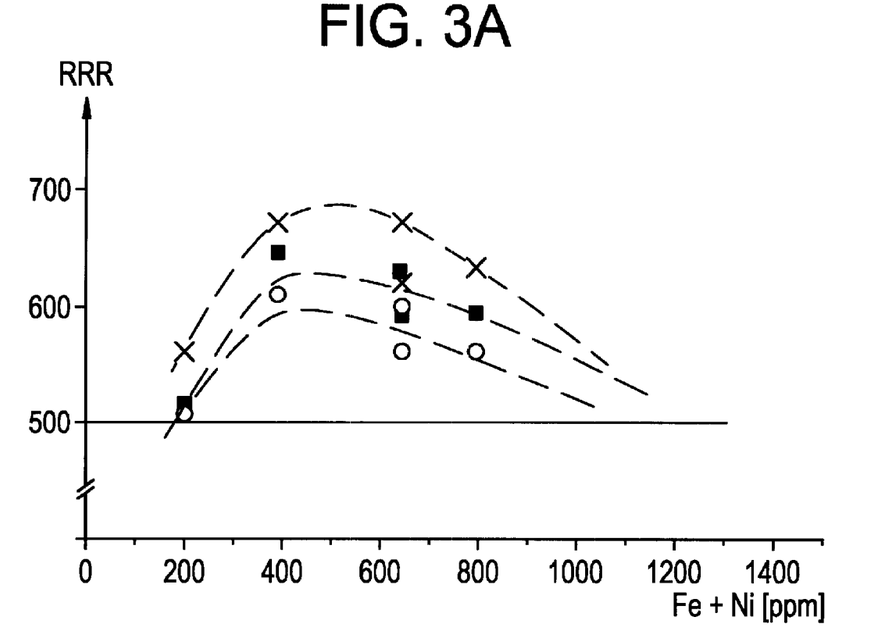
FIG. 3 graphically shows values of RRR (FIG. 3a) and the yield stress (FIG. 3b) obtained on preforms according to the invention.
Figure 3B:
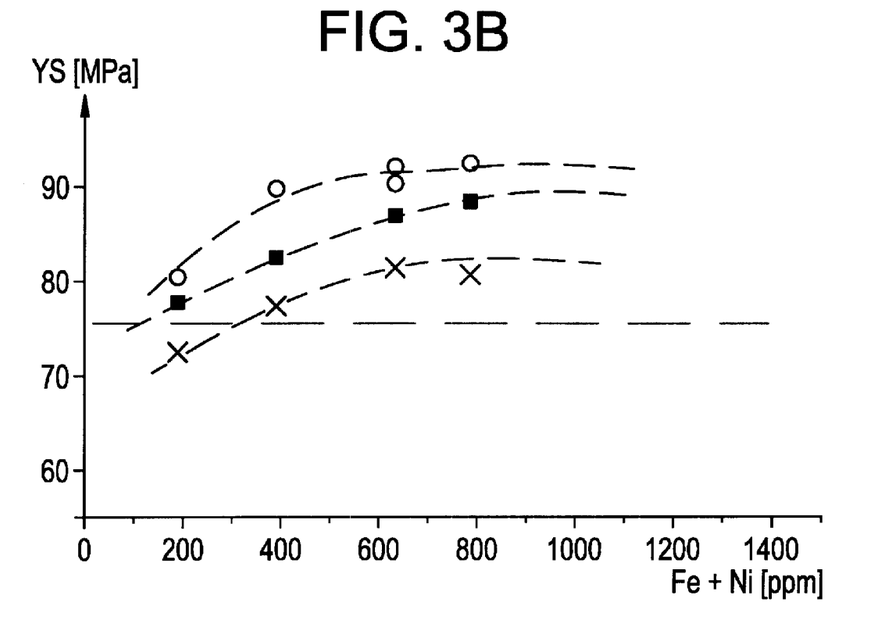

Finally, the 10 mm diameter wire blank samples to which the precipitation annealing mentioned above was applied, were cold drawn by traction in order to evaluate the variation in their resistivity and their yield stress after this type of cold mechanical working treatment (that causes hardening by deformation). The samples were subjected to elongations of 10, 15, 20 and 25% corresponding to reductions in the cross-section equal to 0, 9, 13, 16.7 and 20%. The mechanical properties and the RRR values were then measured on these cold drawn samples. Table 4 shows the results obtained. FIG. 3 shows the results obtained for a cold reduction in the cross-section equal to 13% (X), 16.7% (■) and 20% (○) (the dashed lines have been added to show visual guidelines).

TABLE 4

| Alloy | | Cold cross-section reduction | | | | |
|---|---|---|---|---|---|---|
|  |  | 0% | 9% | 13% | 16.7% | 20% |
| E1 | 0.2% Y.S. [MPa] | 15 | 62 | 72 | 77 | 81 |
|  | RRR | 680 | 585 | 560 | 515 | 506 |
| E2 | 0.2% Y.S. [MPa] | 18 | 66 | 77 | 83 | 90 |
|  | RRR | 910 | 715 | 670 | 645 | 610 |
| E3 | 0.2% Y.S. [MPa] | 21 | 70 | 81 | 88 | 93 |
|  | RRR | 825 | 660 | 630 | 595 | 560 |
| E4 | 0.2% Y.S. [MPa] | 19 | 73 | 82 | 87 | 92 |
|  | RRR | 890 | 700 | 670 | 630 | 600 |
| E5 | 0.2% Y.S. [MPa] | 18 | 72 | 82 | 87 | 91 |
|  | RRR | 805 | 660 | 620 | 590 | 560 |

Therefore, it is found that the alloys chosen in this way with relatively low contents of added elements (<1000 ppm total), that have been subjected to the described treatments to reduce the cross-section and for precipitation annealing can give quite exceptional RRR/yield stress combinations through a relatively limited cold final reduction in the cross-section, such as RRR>650 and Y.S.>80 MPa at ambient temperature, RRR>600 and Y.S.>85 MPa at ambient temperature or RRR>550 and Y.S.>90 MPa at ambient temperature, by an appropriate choice of the amount of the final cold reduction of the cross-section. It is also significant that these performances can be achieved for a wide range of compositions (compositions E2, E3, E4 and E5), the composition E1 only slightly apart from the others. In particular, the demonstrated efficiency of the precipitation treatment on the hot work hardened preform, and the small differences in the RRR and the mechanical properties between grades containing 400 ppm [Fe+Ni], 650 ppm [Fe+Ni] and 800 ppm [Fe+Ni] suggests that the total content of [Fe+Ni] may be increased up to 1200 ppm or 1500 ppm without introducing any disadvantage.

To the best of our knowledge, results of this type have never been obtained with binary Al—Ni type alloys (and even more certainly not with Al—Fe alloys), even with higher contents of elements of addition.

Example 2

The same tests were repeated under the same conditions on the alloy with formulation E4 (250 ppm Fe and 400 ppm Ni), but using a base aluminum with high contents of titanium (5 ppm) and vanadium (2 ppm).

One sample was not submitted to the additional boron treatment (in other words it did not contain any boron addition); another sample was produced with the addition of 20 ppm of boron which was added in the form of a master alloy with 4% by weight of B. The following RRR values were observed after hot drawing and precipitation annealing:

alloy not treated with boron: RRR=600;

alloy treated with boron: RRR=900.

These results show the high efficiency of boron as an element of addition when elements such as titanium are present in the base aluminum, even in small quantities. Larger quantities of boron can be added without significantly reducing the resistivity since boron is only very slightly soluble in solid aluminum and the excess boron precipitates in the form of aluminum boride $AlB_2$ which only has a very small effect on the resistivity. Larger additions of boron can encourage even more complete precipitation of the Ti, V and Zr elements that have a very bad influence on the electrical conductivity.

Example 3

This test corresponds to semi-industrial production.

A furnace made of very pure alumina was used to produce 500 kg of an alloy with Fe and Ni contents equal to Fe=259±2 ppm and Ni=438±3 ppm, hence Fe+Ni=697 ppm and Fe/(Fe+Ni)=0.37. The total content of inevitable impurities, in other words elements other than Fe and Ni, was about 15 ppm, including particularly Si=3.6±0.3 ppm; Cu=1.5±0.2 ppm; Zn=1.9±0.3 ppm and Mg=0.2±0.1 ppm.

This alloy was cast by vertical semi-continuous casting at a rate of 140 mm/min in 148 mm diameter billets.

Examinations were made on the cast structure by electronic scanning microscopy on slices of these billets, that revealed the presence of a low density of precipitates in the form of "sand roses" containing iron, nickel and aluminum simultaneously in proportions compatible with the intermetallic precipitates with formula $Al_9Fe_xNi_{2-x}$. The size of these precipitates was of the order of 3 $\mu$m to 20 $\mu$m.

The RRR of the alloy in the as cast state was also measured and values between 275 and 315 were found (with an average value of 290).

A 24-hour precipitation annealing was performed at 420° C. on a billet segment. After this annealing, the measured RRR was found to be between 390 and 415 (with an average value of 400) which shows that the efficiency of this annealing to precipitate the iron and nickel remaining in solid solution was very limited, contrary to the information given in application WO 00/17890 for Al(5N)+Ni binary alloys.

Another 600 mm long unannealed segment was scalped to Ø 140 mm and heated to 370° C., and then extruded at 370° C. into a Ø 9.5 mm wire (corresponding to a reduction in the cross-section by a factor of 217) suitable for use in the conform (CONFORM®) process. The RRR (300 K/4.2 K) and the mechanical properties at ambient temperature were measured in the as drawn state.

The coil thus obtained was then subjected to a 48 hour annealing treatment at 350° C. The RRR (300 K/4.2 K) and the mechanical properties at ambient temperature were measured again.

Finally, samples of this wire to which the precipitation annealing had been applied were cold wrought, to reduce the cross-section by 16.7% (corresponding to a 20% elongation). The mechanical properties of this work hardened wire and the RRR (300 K/4.2 K) were also measured, also at ambient temperature.

The results obtained are given in table 5 below:

TABLE 5

|  | RRR | 0.2% Y.S. [MPa] |
|---|---|---|
| As drawn at 370° C. | 340 | 34 |
| After 48 h annealing at 350° C. | 950 | 18 |
| After cold mechanical working | 650 | 88 |

These results show the particularly advantageous technical effect of the process according to the invention on the electrical and mechanical properties of the aluminum-based stabilizer according to the invention.

The electrical and mechanical properties of the superconducting conductor comprising a high purity Al—Fe—Ni alloy stabilizer according to the invention may easily be adjusted to very high values not achieved by conductors according to prior art, which assures excellent reliability for their use under difficult conditions. Conductors according to the invention have electrical and mechanical properties that are equivalent, or even better than conductors with a copper based stabilizer, such that significant weight savings (more than 50%) can be achieved on superconducting coils (for example for NMRI) with a significantly lower cost, due to the use of a 4N aluminum base that is less expensive than 5N aluminum bases and significantly less expensive than copper.

Another advantage of the invention is that it can be used to produce a higher RRR than prior art, at a minimum imposed yield stress for a given application, which means that the electrical and thermal conductivities will be higher for equal mechanical properties. Consequently, it would be possible to reduce the ratio between then cross-section of the stabilizing casing and the conducting core(s), which for a superconducting coil results in more compactness and lighter weight, for the same magnetic properties and for a lower cost of the stabilizing casing. This weight reduction and increased compactness also facilitates cooling down to 4.2 K and subsequently maintaining this temperature which reduces the usage cost particularly due to the lower consumption of liquid helium. Typically, an increase of 20% in the RRR means that the cross-section of the stabilizing casing can be reduced by 10%.

What is claimed is:

1. Superconducting conductor comprising at least one superconducting core and an aluminum based cryogenic stabilizer comprising a high purity Al—Fe—Ni aluminum alloy having a composition consisting essentially of, by weight:

200 ppm$\leq$Fe+Ni$\leq$1500 ppm;
0.20$\leq$Fe/(Fe+Ni)$\leq$0.65;
optionally, B<100 ppm;
impurities other than Fe, Ni and B<0.01% total; and
remainder aluminum.

2. Superconducting conductor according to claim 1, wherein total Fe+Ni in the alloy is less than or equal to 1200 ppm.

3. Superconducting conductor according to claim 1, wherein the impurities in the alloy comprise less than 10 ppm of Si and less than 5 ppm of Mn.

4. Superconducting conductor according to claim 1, wherein the total of impurities other than Fe, Ni and B in the alloy is less than 0.005%.

5. Superconducting conductor according to claim 1, wherein the total of impurities other than Fe, Ni and B in the alloy is less than 0.001%.

6. Superconducting conductor according to claim 1, wherein the alloy comprises between 20 and 100 ppm of boron.

7. Superconducting conductor according to claim 1, wherein the aluminum of said alloy comprises less than 20 ppm total Fe and Ni in solid solution.

8. Superconducting conductor according to claim 1, in the form of a wire or a cable.

9. Cryogenic stabilizer preform, comprising a high purity Al—Fe—Ni aluminum alloy having a composition consisting essentially of, by weight:

200 ppm$\leq$Fe+Ni$\leq$1500 ppm;
0.20$\leq$Fe/(Fe+Ni)$\leq$0.65;
optionally, B<100 ppm;
impurities other than Fe, Ni and B<0.01% total; and
remainder aluminum.

10. Preform according to claim 9, wherein total Fe+Ni in the alloy is less than or equal to 1200 ppm.

11. Preform according to claim 9, wherein the impurities in the alloy comprise less than 10 ppm of Si and less than 5 ppm of Mn.

12. Preform according to claim 9, wherein the total of impurities other than Fe, Ni and B in the alloy is less than 0.005%.

13. Preform according to claim 9, wherein the total of impurities other than Fe, Ni and B in the alloy is less than 0.001%.

14. Preform according to claim 9, wherein the alloy comprises between 20 and 100 ppm of boron.

15. Preform according to claim 9, wherein the aluminum of said alloy comprises less than 20 ppm total Fe and Ni in solid solution.

16. Preform according to claim 9, in the form of a wire, a bar or a hollow bar.

17. Preform according to claim 9, which has been formed utilizing a step of hot mechanical working of the preform leading to a reduction in cross-section by a factor of at least 10.

18. Preform according to claim 17, wherein the hot mechanical working step has been carried out at a temperature of between 200 and 400° C.

19. Preform according to claim 17, which has been formed utilizing a step of thermal precipitation treatment carried out on said preform after the mechanical working step, said thermal precipitation treatment including annealing for at least 8 hours at a temperature of between 300° C. and 400° C.

20. Process for obtaining a cryogenic stabilizer preform according to claim 9, comprising the steps of:
preparing said alloy by melting and alloying constituent elements; and
forming said alloy into an as cast preform by solidification and shaping.

21. Process according to claim 20, wherein the preform is elongated with a constant straight cross section.

22. Process according to claim 20, wherein the solidification and shaping are performed by continuous or semi-continuous casting, or by molding.

23. Process according to claim 20, further comprising a hot mechanical working operation on the as cast preform, with a reduction in straight cross-section of at least 90%.

24. Process according to claim 23, wherein that the mechanical working operation is performed by extrusion or rolling.

25. Process according to claim 23, wherein the hot mechanical working operation is performed at a temperature of between 200 and 400° C.

26. Process according to claim 23, additionally comprising a precipitation heat treatment carried out on the preform after the mechanical working operation, at a temperature between 300 and 400° C. for a duration equal to at least 8 hours.

27. Process for the production of a superconducting conductor comprising at least one superconducting core and an aluminum based cryogenic stabilizer comprising a high purity Al—Fe—Ni aluminum alloy having a composition consisting essentially of, by weight:

200 ppm$\leq$Fe+Ni$\leq$1500 ppm;

0.20$\leq$Fe/(Fe+Ni)$\leq$0.65;

optionally, B<100 ppm;

impurities other than Fe, Ni and B<0.01% total; and remainder aluminum, comprising the steps of:
preparing said alloy by melting and alloying constituent elements;
forming said alloy into an as cast preform by solidification, shaping, optionally hot mechanically working and optionally precipitation heat treating; and
inserting at least one superconducting core in said preform to form a blank.

28. Process according to claim 27, wherein said insertion is carried out utilizing a continuous co-extrusion process.

29. Process according to claim 27, wherein the preform is hollow and the insertion comprises filling the preform.

30. Process according to claim 27, further comprising at least one operation to reduce the blank in cross section.

31. Process according to claim 27, further comprising:
reducing the blank in cross-section to obtain an intermediate blank with a cross-section of between 1.10 and 1.33 times a final cross-section of the superconducting conductor;
an annealing heat treatment of the intermediate blank that produces an annealed blank; and
final cold working of the annealed blank to reduce the cross-section of said annealed blank, resulting in a superconducting conductor with said final cross-section.

32. Process according to claim 31, wherein the annealing heat treatment is carried out for about one hour at a temperature of between about 150 and 350° C.

33. Process according to claim 32, wherein said as cast preform is subjected to said hot mechanically working and said precipitation heat treatment, and said annealing heat treatment is carried out at a temperature lower than that of said precipitation heat treatment.

* * * * *

UNITED STATES PATENT AND TRADEMARK OFFICE
CERTIFICATE OF CORRECTION

PATENT NO. : 6,508,888 B1
DATED : January 21, 2003
INVENTOR(S) : Michael Leroy

It is certified that error appears in the above-identified patent and that said Letters Patent is hereby corrected as shown below:

<u>Drawings,</u>
Please replace Figure 2 as issued with Figure 2 as attached hereto.

Signed and Sealed this

Twenty-seventh Day of May, 2003

JAMES E. ROGAN
*Director of the United States Patent and Trademark Office*

FIG. 2